United States Patent [19]

Mohri et al.

[11] Patent Number: 4,953,699
[45] Date of Patent: Sep. 4, 1990

[54] TAPE STRUCTURE PROVIDED WITH ELECTRONIC COMPONENTS

[75] Inventors: Akira Mohri; Toshikazu Kato, both of Fukui, Japan

[73] Assignee: Murata Manufacturing Co., Ltd., Japan

[21] Appl. No.: 811,664

[22] Filed: Dec. 20, 1985

[30] Foreign Application Priority Data

Dec. 24, 1984 [JP] Japan ............................ 59-200905[U]

[51] Int. Cl.⁵ ............................................. B65D 73/02
[52] U.S. Cl. .................................... 206/330; 206/820; 361/417
[58] Field of Search .................... 206/330, 328, 820; 361/398, 417, 419, 420, 405; 156/269, 522; 83/451–467

[56] References Cited

U.S. PATENT DOCUMENTS

| | | | |
|---|---|---|---|
| 3,361,251 | 1/1968 | Olsson | 206/330 |
| 3,465,874 | 9/1969 | Hugle et al. | 206/330 |
| 3,586,161 | 6/1971 | Marcus | 206/820 X |
| 3,977,522 | 8/1976 | van Der Aker | 206/330 |
| 4,242,139 | 1/1981 | Masujima et al. | 206/330 |
| 4,453,633 | 6/1984 | Hamuro et al. | 206/330 |
| 4,557,782 | 12/1985 | Swanson | 206/330 X |
| 4,568,416 | 2/1986 | Okui et al. | 206/330 X |

*Primary Examiner*—Bryon P. Gehman
*Attorney, Agent, or Firm*—Ostrolenk, Faber, Gerb & Soffen

[57] ABSTRACT

A tape structure provided with electronic components includes a base tape having a width and an attachment tape having a width which is approximately half the width of the base tape. The attachment tape extends parallel to and along a first half side of the base tape, the base tape and the attachment tape being bonded together so as to support the terminal legs of the electronic components between the base tape and the attachment tape. Projections are provided on a second half side of the base tape. When the tape structure is cut into segments, and held between a pallet and pressing arms, the projections prevent each segment from being turned while the segment is held between the pallet and the pressing arms.

9 Claims, 4 Drawing Sheets

TAPE STRUCTURE PROVIDED WITH ELECTRONIC COMPONENTS

BACKGROUND OF THE INVENTION

1. Field of the invention

The present invention relates to a tape structure provided with electronic components, such as resistors, capacitors, etc., each having terminal legs.

2. Description of the Prior Art

For use in the assembly line, the electronic components, such as resistors, capacitors, etc., are aligned in a predetermined pitch and are carried by a tape structure.

As shown in FIG. 1, the tape structure 20 is defined by a base tape 50 and an adhesive tape 60. The base tape 50 has perforations 80 formed along the center thereof with a predetermined pitch. The perforations are used for guiding and advancing the tape structure. Each electric component 10 is defined by a body portion 30 and usually two terminal legs 40a and 40b extending from the body portion 30. The electric components 10 are supported by the tape structure such that terminal legs 40a and 40b are placed across the base tape 50 and are held in place by the adhesive tape 60 applied across terminal legs 40a and 40b over the base tape. When the adhesive tape is applied, corrugations 70a and 70b are formed in the adhesive tape where the terminal legs 40a and 40b exist underneath thereof As indicated in FIG. 1, adhesive tape 60 extends parallel to base tape 50.

Base tape 50 is formed, for example, of a relatively strong and thick paper, such as Kraft paper, whereas adhesive tape 60 is formed, for example, of a thermoplastic with a coating of a thermoplastic adhesive on its one side. One example of the above described tape structure is disclosed in U.S. Pat. No. 4,453,633.

The tape structure as described above is set in an automatic insertion machine (not shown), which cuts the tape structure into segments A0 As shown in FIG. 2, each segment A0 is held between a pallet 12 and a pair of pressing arms 11a and 11b, and is carried to a severing station where the terminal legs are cut to separate the electronic component from the tape structure. The separated electronic component 10 is carried by a holder (not shown) and its terminal legs are inserted into holes of a printed circuit board.

The prior art tape structure has a problem as explained below.

As apparent from FIGS. 1 and 2, recently, from the viewpoint of saving material and reducing the cost, the width of adhesive tape 60 is reduced to narrower than half the width of base tape 50, and also, the terminal legs are shortened so as to extend only halfway across the base tape. The width of the base tape is maintained the same so that the tape structure can be loaded in the conventional automatic insertion machine. When a tape structure with a full size adhesive tape and full length terminal legs is used, such as disclosed in U.S. Pat. No. 4,243,139, each segment A0 can be secured tightly between pallet 12 and pressing arms 11a and 11b, because both pressing arms 11a and 11b are placed between the corrugations. However, when the tape structure shown in FIGS. 1 and 2 is used, only the pressing arm 11b is held between corrugations 70a and 70b. The other pressing arm 11a is placed on a plain face of base tape 50. Accordingly, segment A0 can be easily pivoted, as indicated by an arrow X, about a place under the end of pressing arm 11b, particularly during the carrying or at the severing station. If the terminal legs are severed while the segment is pivoted, the holder may pick up the separated electronic component with the terminal legs directed in the wrong direction. Thus, the electronic component may not be successfully inserted into the printed circuit board.

SUMMARY OF THE INVENTION

The present invention has been developed with a view to substantially solving the above described problem and has for its primary object to provide an improved tape structure which, after being cut into segments, can be tightly secured between the pallet and the pressing arms, and yet using the half width adhesive tape and electronic components with short terminal legs.

It is also an important object of the present invention to provide a tape structure of the above described type which is simple in structure and can readily be manufactured at low cost.

In accomplishing these and other objects, a tape structure according to the present invention comprises a base tape and an attachment tape having a width which is approximately half the width of the base tape. The attachment tape extends parallel to and along a first half side of the base tape. The base tape and the attachment tape are bonded together so as to support the terminal legs of the electronic components between the base tape and the attachment tape.

According to the present invention, projections are provided on a second half side of the base tape. When the tape structure is cut into segments, and held between a pallet and pressing arms, the projections prevent each segment from being turned while the segment is held between the pallet and the pressing arms.

BRIEF DESCRIPTION OF THE DRAWINGS

These and other objects and features of the present invention will become apparent from the following description of preferred embodiments thereof with reference to the accompanying drawings, throughout which like parts are designated by like reference numerals, and in which.

DESCRIPTION OF THE PREFERRED EMBODIMENTS

Figure 1:
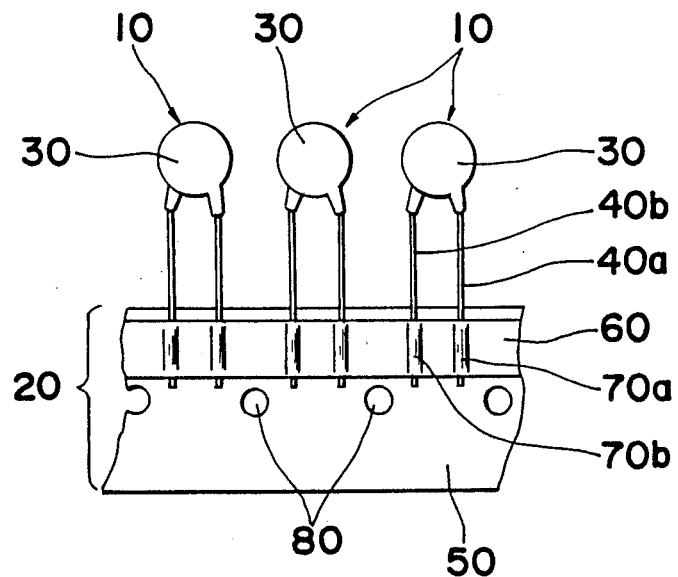
FIG. 1 is a fragmentary plan view of a tape structure according to the prior art.
Figure 2:
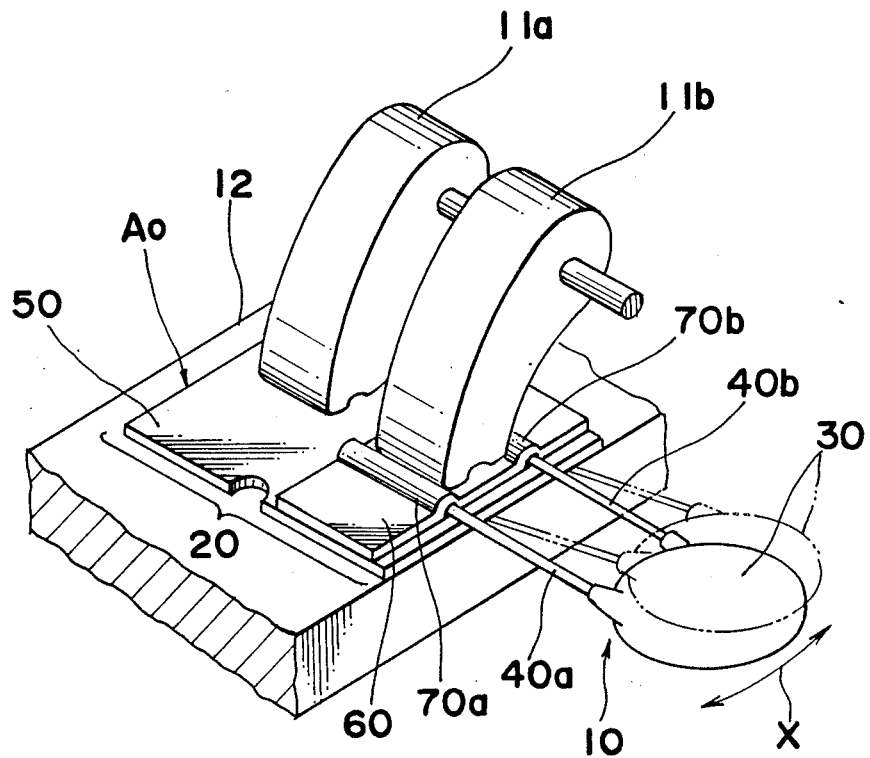
FIG. 2 is a perspective view showing a manner in which a cut out segment of the prior art tape structure is carried.
Figure 3:
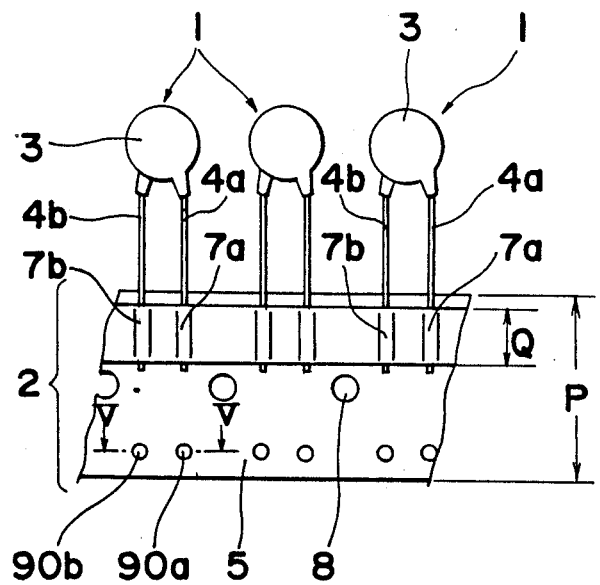
FIG. 3 is a fragmentary plan view of a tape structure according to a first embodiment of the present invention.

Referring to FIG. 3, a tape structure 2 according to a first embodiment of the present invention is shown. The tape structure 2 of the present invention is for supporting electronic components 1, such as resistors, capacitors, etc., which are aligned with a predetermined pitch. Each electronic component 1 is defined by a body portion 3 and usually two terminal legs 4a and 4b extending from body portion 3. It is possible to support electronic components that have more than two terminal legs or only one terminal leg.

The tape structure shown comprises a base tape 5 and an attachment tape or an adhesive tape 6. Adhesive tape 6 has a width Q which is less than half the width P of base tape 5, and it extends parallelly and along the upper half portion of base tape 5, when viewed in FIG. 3. Base tape 5 and adhesive tape 6 are bonded together so as to support electronic components between tapes 5 and 6. More specifically, electronic components 1 are supported by the tape structure such that terminal legs 4a and 4b are placed halfway across base tape 5 and are held in place by adhesive tape 6 applied across terminal legs 4a and 4b over the base tape. When the adhesive tape is applied, corrugations 7a and 7b are formed where terminal legs 4a and 4b exist underneath thereof.

The base tape 5 has perforations 8 formed along the center thereof with a predetermined pitch. The perforations are used for guiding and advancing the tape structure. The base tape 5 is formed, for example, by a relatively strong and thick paper, such as a Kraft paper, whereas adhesive tape 6 is formed, for example, by a thermoplastic with a coating of a thermoplastic adhesive on its one side. In this case, the bonding of the two tapes is done by the application of heat. Any other known flexible materials can be used for base tape 5 or for adhesive tape 6. Also the bonding of the two tapes can be done by any other known manner, for example, by the application of a bonding agent.

According to the first embodiment, base tape 5 is further formed with projections 90a and 90b at the lower half portion of base tape 5, when viewed in FIG. 3, along the extended lines of corrugations 7a and 7b, respectively Each of projections 90a and 90b of the first embodiment has a semi-spherical configuration, and is formed by the method of press work.

Figure 5:
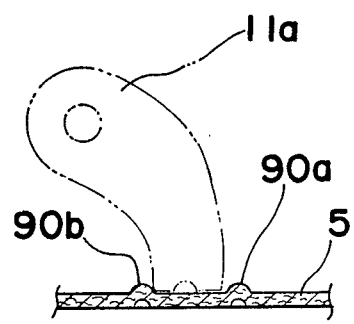
FIG. 5 is a cross-sectional view taken along a line V—V shown in FIG. 3.
Figure 4:
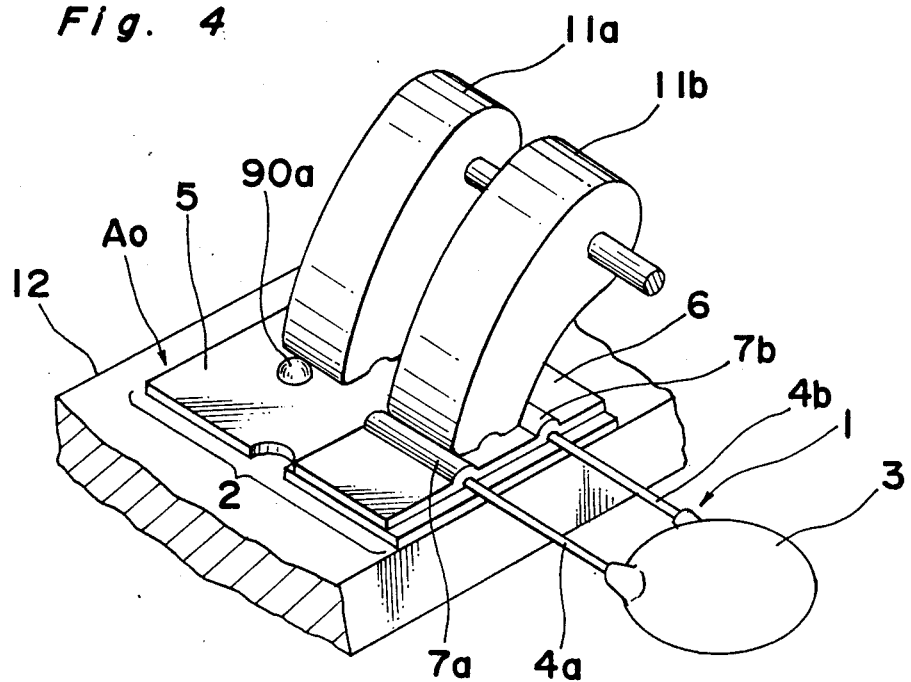
FIG. 4 is a perspective view showing a manner in which a cut out segment of the tape structure of the first embodiment is carried.

The tape structure as described above is set in an automatic insertion machine (not shown), which cuts the tape structure to segments A0. As shown in FIG. 4, each segment A0 is held between a pallet 12 and a pair of pressing arms 11a and 11b, and is carried to a severing station where the terminal legs are cut to separate the electronic component from the tape structure. The separated electronic component 10 is carried by a holder (not shown) and is inserted into a printed circuit board. According to the first embodiment, pressing arm 11a fits in between projections 90a and 90b, as shown in FIG. 5, and, at the same time, pressing arm 11b fits in between corrugations 7a and 7b. Accordingly, segment A0 will not be pivoted during the carrying or at the severing station.

Figure 6:
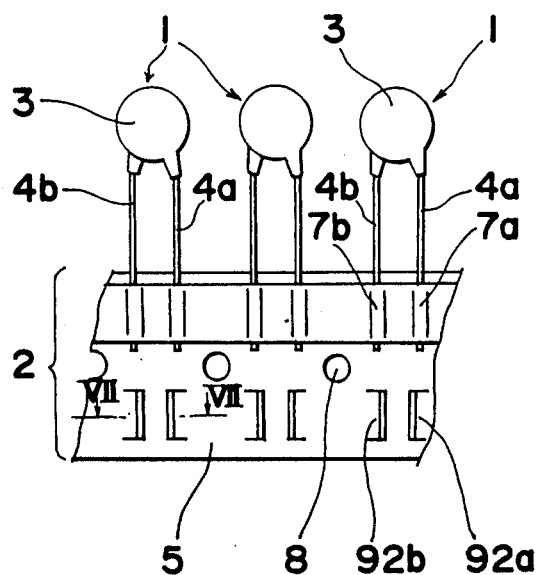
FIG. 6 is a fragmentary plan view of a tape structure according to a second embodiment of the present invention.
Figure 7:
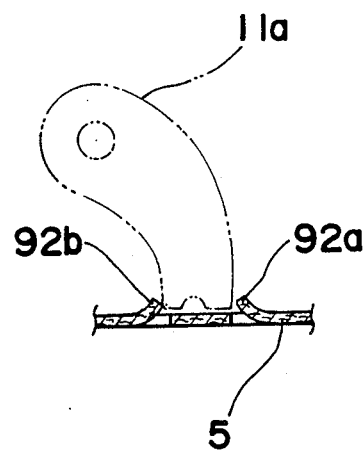
FIG. 7 is a cross-sectional view taken along a line VII—VII shown in FIG. 6.

Referring to FIGS. 6 and 7, a tape structure 2 according to a second embodiment of the present invention is shown. In this embodiment, instead of projections 90a and 90b, projections 92a and 92b are formed at the lower half portion of base tape 5, when viewed in FIG. 6, along the extended lines of corrugations 7a and 7b, respectively. Each of projections 92a and 92b of the second embodiment is formed by cutting base tape 5 in a shape of "U" and raising the tongue portion upwards, defining the projection. The tongue portions 92a and 92b face each other, so that pressing arm 11a can be fitted between the tongues, as shown in FIG. 7.

Figure 8:
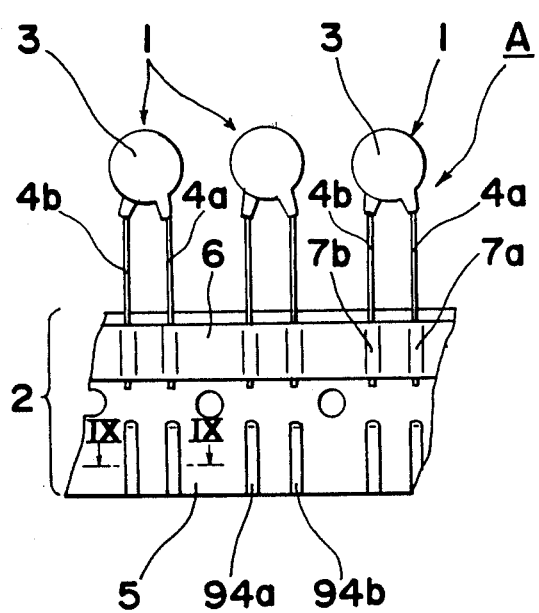
FIG. 8 is a fragmentary plan view of a tape structure according to a third embodiment of the present invention.
Figure 9:
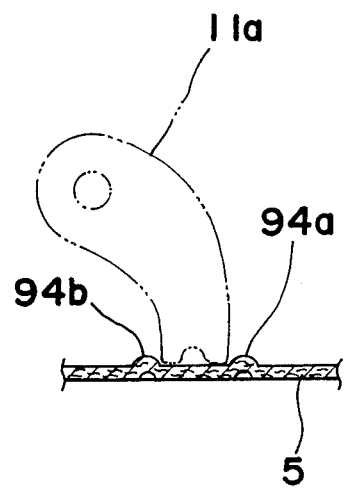
FIG. 9 is a cross-sectional view taken along a line IX—IX shown in FIG. 8.

Referring to FIGS. 8 and 9, a tape structure 2 according to a third embodiment of the present invention is shown. When compared with the first embodiment, projections 9a and 94b are formed, instead of projections 90a and 90b, at the lower half portion of base tape 5, when viewed in FIG. 8. Each of projections 94a and 94b of the third embodiment has an elongated arcade-like configuration formed by the step of press work. Projections 94a and 94b are forward along the extended lines of corrugations 7a and 7b, respectively so that pressing arm 11a can be fitted between the elongated projections, as shown in FIG. 9.

Figure 10:
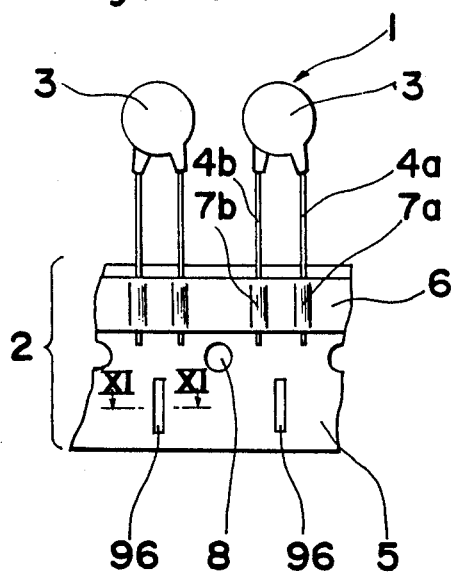
FIG. 10 is a fragmentary plan view of a tape structure according to a fourth embodiment of the present invention.
Figure 11:
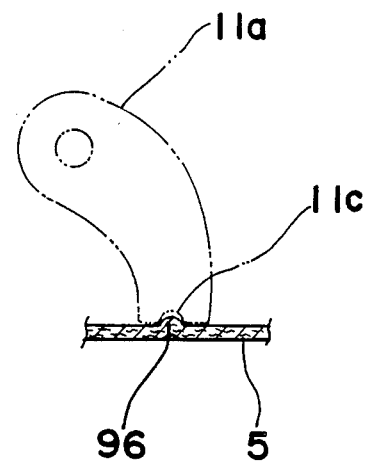
FIG. 11 is a cross-sectional view taken along a line XI—XI shown in FIG. 10.

Referring to FIGS. 10 and 11, a tape structure 2 according to a fourth embodiment of the present invention is shown. When compared with the first embodiment, one projection 96 is formed, instead of projections 90a and 90b, at the lower half portion of base tape 5, when viewed in FIG. 8. Projection 96 of the fourth embodiment has an elongated arcade-like configuration formed by the step of press work. Projection 96 is formed along a line extended between the extended lines of corrugations 7a and 7b, so that a groove 11c formed in a pressing face of pressing arm 11a engages projection 96, as shown in FIG. 11.

Figure 12:
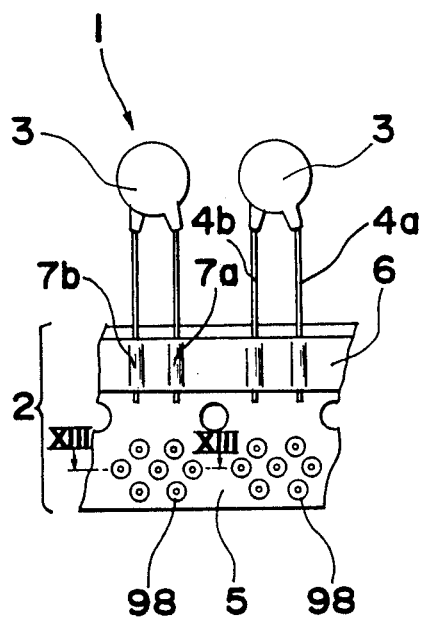
FIG. 12 is a fragmentary plan view of a tape structure according to a fifth embodiment of the present invention.
Figure 13:
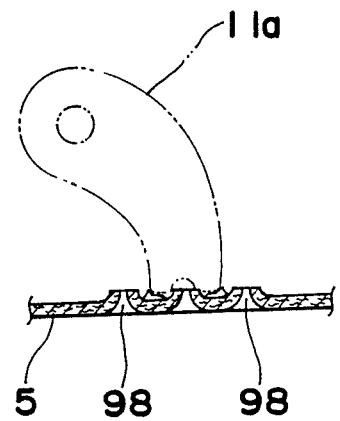
FIG. 13 is a cross-sectional view taken along a line XIII—XIII shown in FIG. 12.

Referring to FIGS. 12 and 13, a tape structure 2 according to a fifth embodiment of the present invention is shown. When compared with the first embodiment, instead of projections 90a and 90b, a number of small projections 98 are provided with a center thereof being opened. Projections 96 of the fifth embodiment may be formed in an organized pattern with an equal distance separated from each other, or they may be formed at random by the step of press work. When pressing arm 11a comes down on segment A0, any projections 96 placed under the pressing face of arm 11a will be depressed, so that arm 11a engages projections 96 located around arm 11a and within groove 11c of arm 11a, as shown in FIG. 13.

As described above, according to the present invention, the electronic components are attached to one half-side portion of base tape 5 by the attachment of adhesive tape, and projections are provided at the other half-side portion of base tape 5 so as to make a slip-proof surface with respect to the pressing surface of press arm 11a.

Since the tape structure according to the present invention has slip-proof projections, the tape structure, after being cut into segments, can be tightly secured between the pallet and the pressing arms, and yet use the half width adhesive tape and electronic components with short terminal legs. Thus, the tape structure of the present invention can be manufactured at low cost with the aforementioned problem being solved.

What is claimed is:

1. A tape structure having first and second half sides defined therein and being provided with electronic components each having one or more terminal legs, for supplying the components to an automatic component mounting machine having at least one pressing arm for pressing at least the second half side of the tape structure, the tape structure comprising:
   (a) a base tape having a width;
   (b) an attachment tape having a width which is approximately half the width of said base tape, said attachment tape extending parallel to and along said first half side of said base tape;
   said base tape and said attachment tape being bonded together so as to support said terminal legs of said electronic components between said base tape and said attachment tape and thereby defining corrugations in said attachment tape where said terminal legs are located; and
   (c) projection means provided on said second half side of said base tape, said projection means being configured and located for engaging the pressing arm so as to prevent rotation of the tape structure while said tape structure is pressed by said pressing arm.

2. A tape structure as claimed in claim 1, wherein said projection means comprises first and second semispherical projections formed along extended lines of said corrugations.

3. A tape structure as claimed in claim 1, wherein said projection means comprises first and second tongue projections, each formed by cutting said base tape in a shape of "U" and raising a tongue portion upwards, said first and second tongue projections being directed toward each other, and aligned along extended lines of said corrugations, respectively.

4. A tape structure as claimed in claim 1, wherein said projection means comprises first and second elongated arcade shaped projections formed along extended lines of said corrugations, respectively.

5. A tape structure as claimed in claim 1, wherein said projection means comprises an elongated arcade shaped projection formed along a line extended between extended lines of said corrugations.

6. A tape structure as claimed in claim 1, wherein said projection means comprises a plurality of small projections with a center thereof being opened.

7. A tape structure as claimed in claim 1, wherein said attachment tape has an adhesive agent deposited thereon for the bonding on said base tape.

8. A tape structure having first and second half sides defined therein and being provided with electronic components each having one or more terminal legs, for supplying the components to an automatic component mounting machine having at least one pressing arm, the pressing arm having a groove in a pressing face thereof, for pressing at least the second half side of the tape structure, the tape structure comprising:
   (a) a base tap having a width;
   (b) an attachment tape having a width which is approximately half the width of said base tape, said attachment tape extending parallel to and along said first half side of said base tape;
   said base tape and said attachment tape being bonded together so as to support said terminal legs of said electronic components between said base tape and said attachment tape and thereby defining corrugations in said attachment tape where said terminal legs are located, said corrugations being generally parallel to said groove in said pressing face of said pressing arm; and
   (c) projection means provided on said second half side of said base tape, said projection means being configured and located for engaging the groove of the pressing arm so as to prevent rotation of the tape structure while said tape structure is pressed by said pressing arm.

9. A tape structure having first and second half sides defined therein and being provided with electronic components each having one or more terminal legs, for supplying the components to an automatic component mounting machine having at least a first pressing arm for pressing the second half side of the tape structure, and a second pressing arm for pressing the first half side of the tape structure, the tape structure comprising:
   (a) a base tape having a width;
   (b) an attachment tape having a width which is approximately half the width of said base tape, said attachment tape extending parallel to and along said first half side of said base tape;
   said base tape and said attachment tape being bonded together so as to support said terminal legs of said electronic components between said base tape and said attachment tape and thereby defining corrugation in said attachment tape where said terminal legs are located,
   said corrugations engaging the second pressing arm so as to prevent rotation of the tape structure while said tape structure is pressed by said pressing arms; and
   (c) projection means provided on said second half side of said base tape, said projection means being configured and located for engaging the pressing arm so as to further prevent rotation of the tape structure while said tape structure is pressed by said pressing arms.

* * * * *